United States Patent
Le Henaff

(10) Patent No.: US 6,781,386 B2
(45) Date of Patent: Aug. 24, 2004

(54) METHOD AND DEVICE FOR MEASURING A LINE ATTENUATION

(75) Inventor: Didier Le Henaff, Versailles (FR)

(73) Assignee: Thales, Paris (FR)

( * ) Notice: Subject to any disclaimer, the term of this patent is extended or adjusted under 35 U.S.C. 154(b) by 6 days.

(21) Appl. No.: 10/344,145

(22) PCT Filed: Aug. 10, 2001

(86) PCT No.: PCT/FR01/02604

§ 371 (c)(1),
(2), (4) Date: Feb. 10, 2003

(87) PCT Pub. No.: WO02/14882

PCT Pub. Date: Feb. 21, 2002

(65) Prior Publication Data

US 2003/0173399 A1 Sep. 18, 2003

(30) Foreign Application Priority Data

Aug. 11, 2000 (FR) .............................. 00 10732

(51) Int. Cl.[7] .............................................. G01R 31/11
(52) U.S. Cl. ...................................... 324/534; 324/614
(58) Field of Search .......................... 73/61.44, 861.28; 128/925; 324/534, 614, 620; 356/5.06

(56) References Cited

U.S. PATENT DOCUMENTS

| 5,128,619 | A | | 7/1992 | Bjork et al. ................. 324/533 |
|---|---|---|---|---|
| 5,465,287 | A | | 11/1995 | Egozi .............................. 379/5 |
| 5,548,222 | A | | 8/1996 | Jensen et al. ................ 324/628 |
| 5,633,801 | A | * | 5/1997 | Bottman ....................... 702/65 |
| 5,978,449 | A | * | 11/1999 | Needle ..................... 379/22.03 |
| 6,237,126 | B1 | * | 5/2001 | Bonitz ........................... 716/4 |
| 6,292,539 | B1 | * | 9/2001 | Eichen et al. .............. 379/1.04 |
| 6,385,297 | B2 | * | 5/2002 | Faulkner et al. ........... 379/1.04 |
| 6,389,109 | B1 | * | 5/2002 | Schmidt et al. ............ 379/1.04 |
| 6,658,052 | B2 | * | 12/2003 | Krinsky et al. ............. 375/222 |
| 6,687,289 | B1 | * | 2/2004 | Bohley ........................ 375/224 |
| 6,687,336 | B1 | * | 2/2004 | Holeys ...................... 379/1.04 |

* cited by examiner

Primary Examiner—Jay Patidar
Assistant Examiner—Walter Benson
(74) Attorney, Agent, or Firm—Lowe Hauptman Gilman & Berner, LLP

(57) ABSTRACT

Accordingly, the invention relates to a process and a device for measuring the attenuation of a line where the measurement process according to the invention makes it possible to measure the attenuation of a line at a given frequency F and includes at least the steps wherein the emission of an electric signal at one end of the electric line, provides a signal that includes a spectral amplitude $A_1$ at the frequency F; the measurement of the signal reflected by the other end of the line, at the end of the line from where the signal was emitted; the determination of the amplitude $A_2$ of the spectral component at the frequency F of the reflected signal; the determination of the attenuation of the line from the ratio of the amplitude $A_2$ to the amplitude $A_1$ where it applies in particular to the rating of asymmetric digital subscriber lines.

16 Claims, 6 Drawing Sheets

METHOD AND DEVICE FOR MEASURING A LINE ATTENUATION

Figure 1:
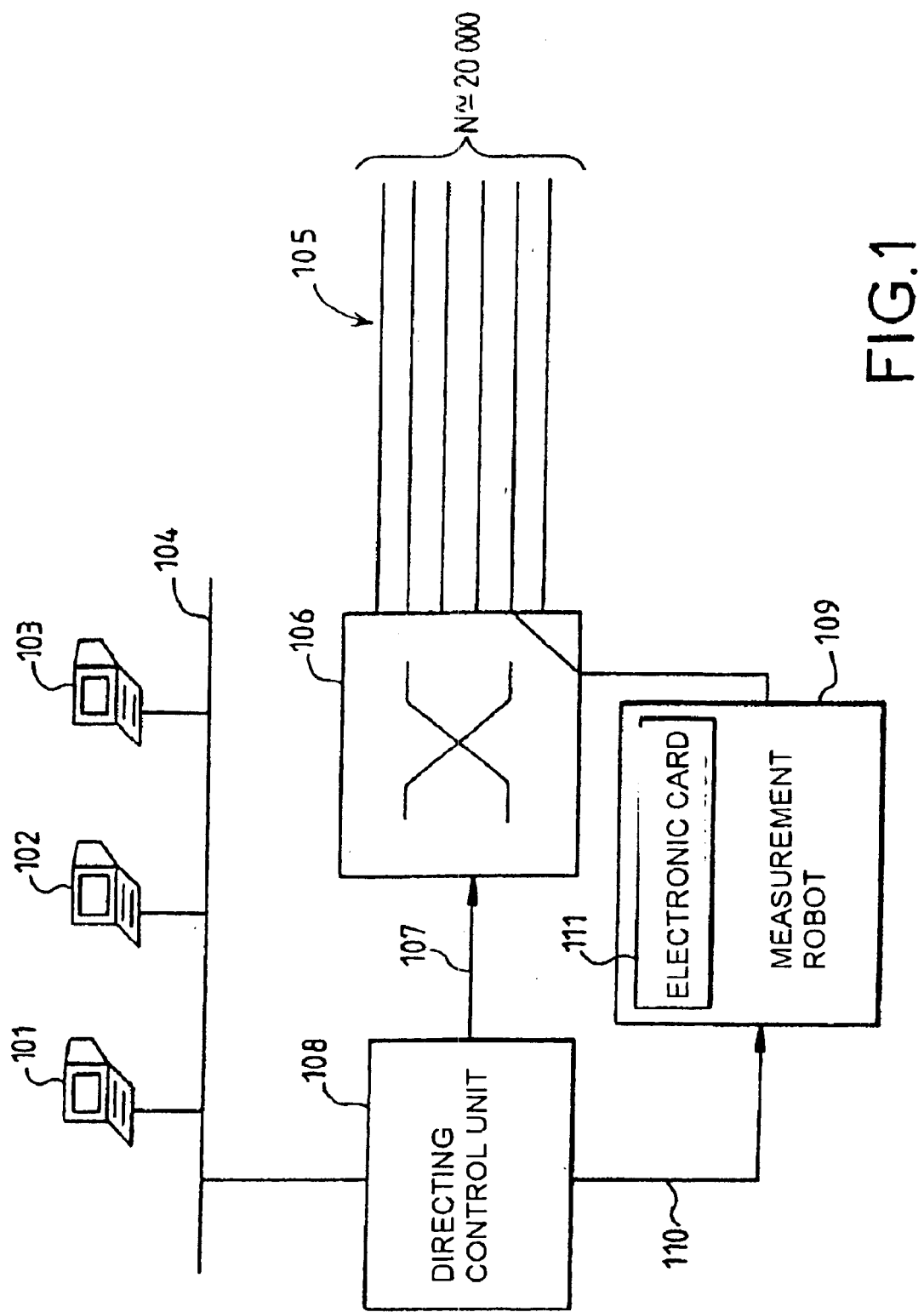

The present invention relates to a process and a device for measuring the attenuation of a line. It applies in particular to the rating of asymmetric digital subscriber lines (ADSL).

Certain telephone operators are seeking to develop ADSL technology so as to offer their subscribers higher Internet transmission throughputs. However, the telephone lines of the networks of these operators are in part not reliable enough to ensure good transmission at these throughputs. These operators have therefore to determine which part of their network can support these transmission throughputs. Hitherto, this determination is based on a theoretical calculation of the attenuation of the electric lines. This calculation makes it possible to determine the average attenuation of the electric lines as a function of their lengths and of their diameters. The maximum theoretical length of the line which can support these transmission throughputs is determined from this attenuation. Knowing the length of the telephone lines of its network, the operator can theoretically determine which part of the network supports throughputs compatible with ADSL technology. Telephone lines having unmodeled defects, the theoretical limits are greater than the actual limits. Operators therefore adopt a safety margin, for example by taking half the theoretical limit, so as to be certain that the lines selected support ADSL technology.

A drawback of this technique is that a part of the network which could support high transmission throughputs is not utilized. In order to utilize the greatest number of lines, that is to say to bring ADSL technology to the maximum of subscribers, it is necessary to carry out measurements of attenuation at 300 kHz. These attenuation measurements make it possible to rate the ADSL lines.

In the known techniques for measuring the attenuation of a line, two technicians are sited at the ends of said line. The first technician emits an electric signal having a known amplitude, the second technician measures the electric signal received at the other extremity of the line. The ratio of the amplitude of the signal emitted to the amplitude of the signal received is the attenuation of the line. A drawback of this technique is that it is expensive since it requires two technicians who have to go to each end of the lines to be tested.

An aim of the invention is to alleviate the aforesaid drawbacks, and in particular to make it possible to measure the attenuation of an electric line from a measurement carried out at one end of the line only, and to do so in an economical manner.

Accordingly, the invention relates to a process and a device for measuring the attenuation of a line. The measurement process according to the invention makes it possible to measure the attenuation of a line at a given frequency F and comprises at least the following steps:

(a) the emission of an electric signal at one end of the electric line, said signal comprising a spectral component of amplitude $A_1$ at the frequency F;
(b) the measurement of the signal reflected by the other end of the line, at the end of the line from where the signal was emitted;
(c) the determination of the amplitude $A_2$ of the spectral component at the frequency F of the reflected signal;
(d) the determination of the attenuation of the line from the ratio of the amplitude $A_2$ to the amplitude $A_1$, the electric signal being emitted for a duration less than the outward and return time of a wave on the line, so as to preclude interference between the signal emitted and the signal reflected during the measurement.

Figure 2:
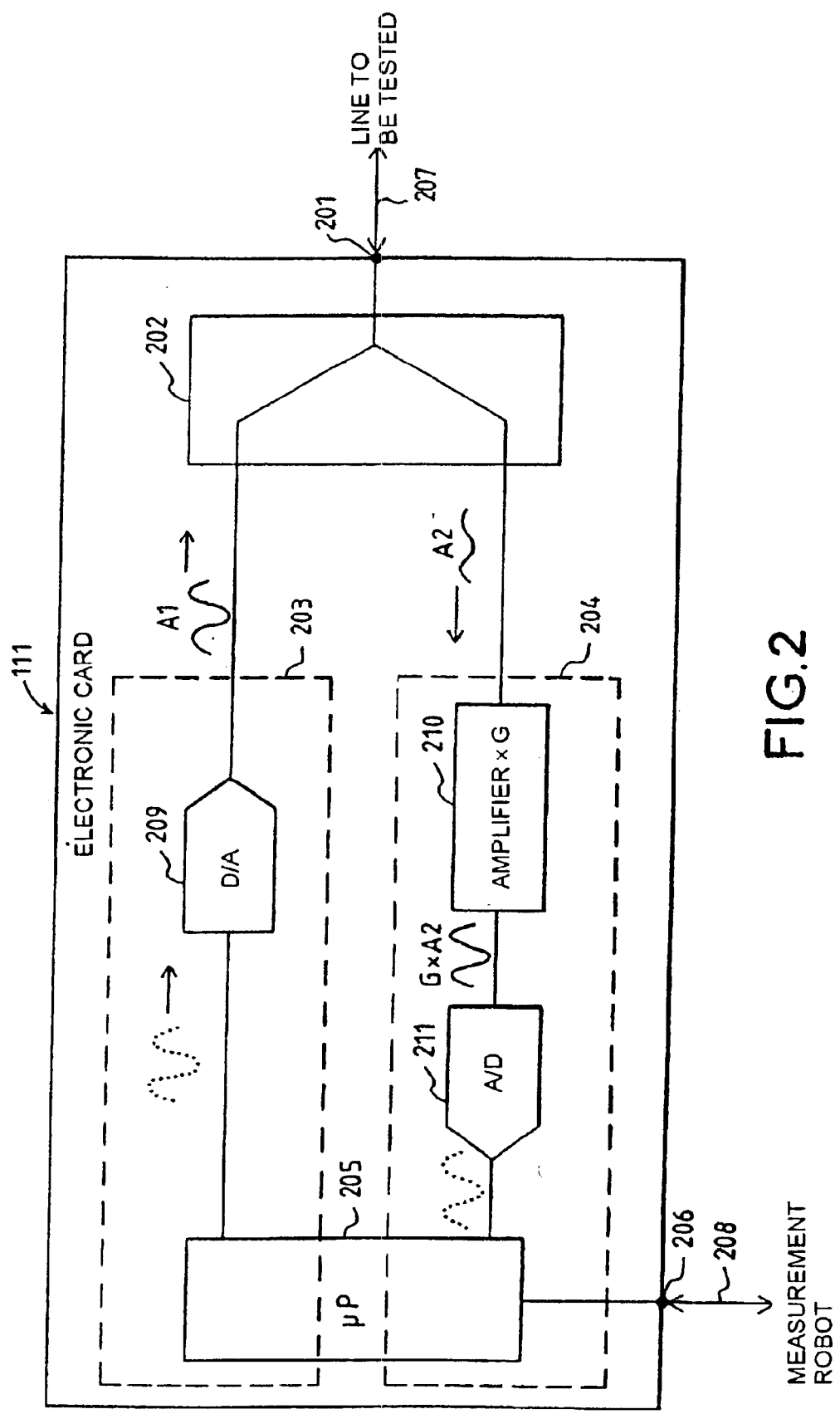
Figure 3:
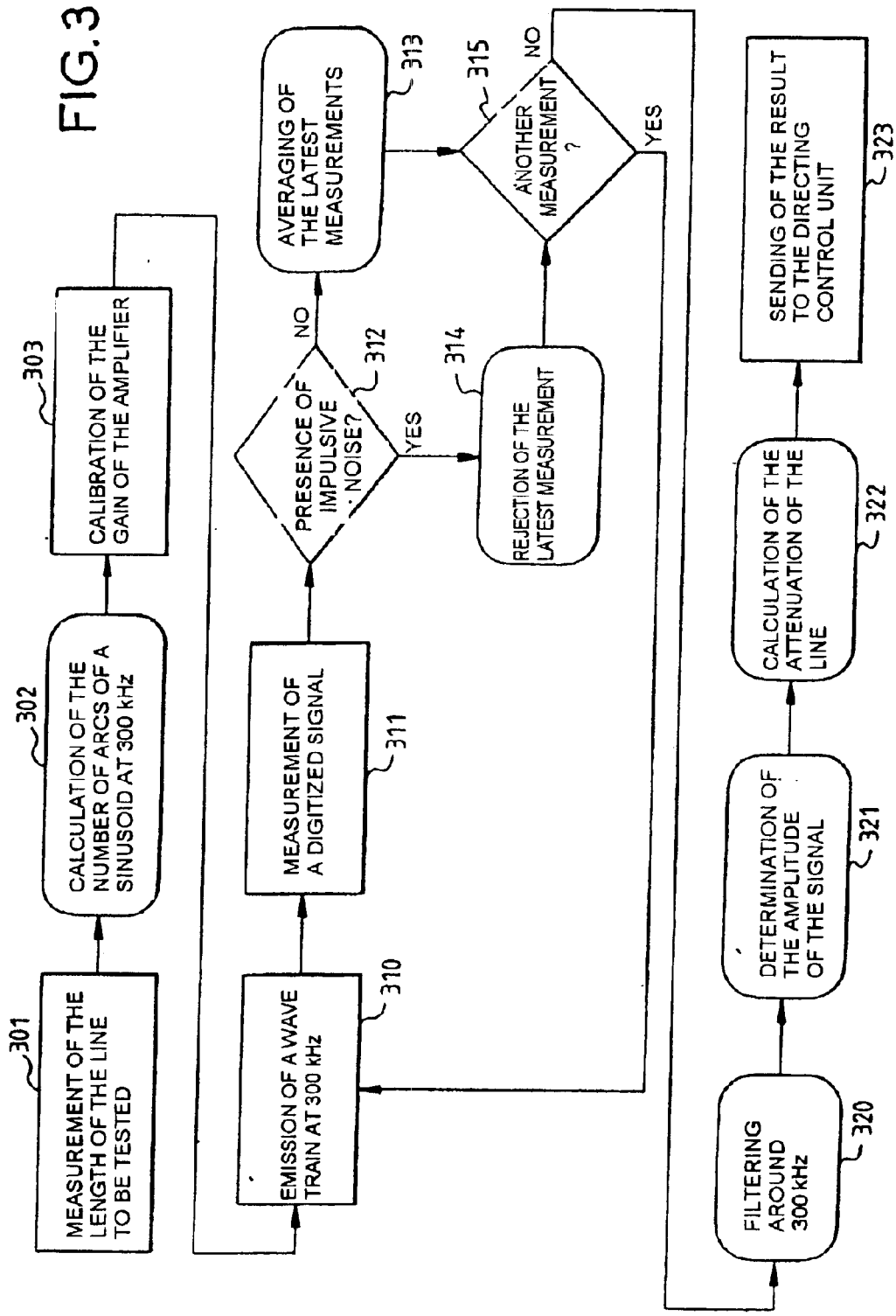
Figure 4:
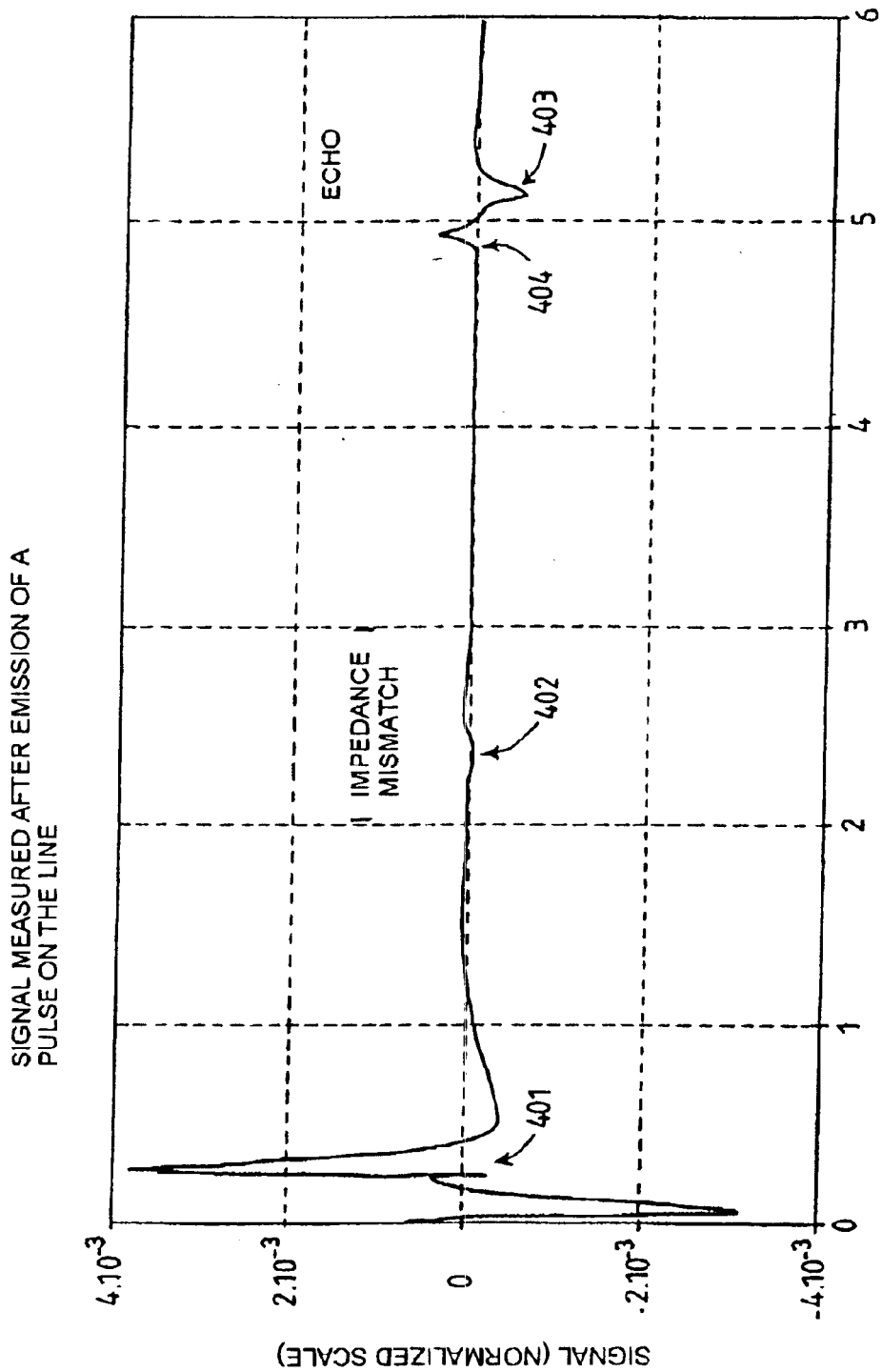
Figure 5:
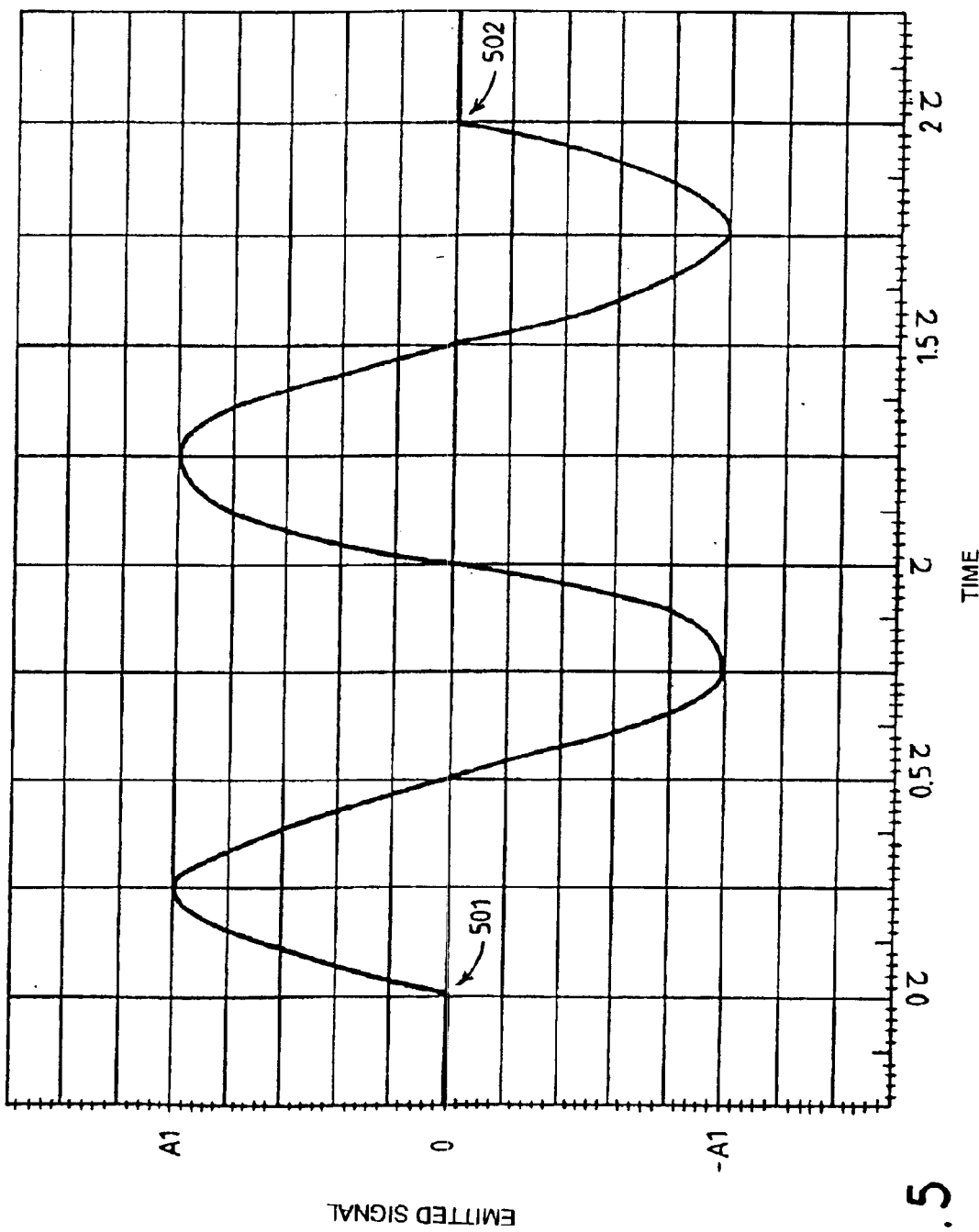
Figure 6:
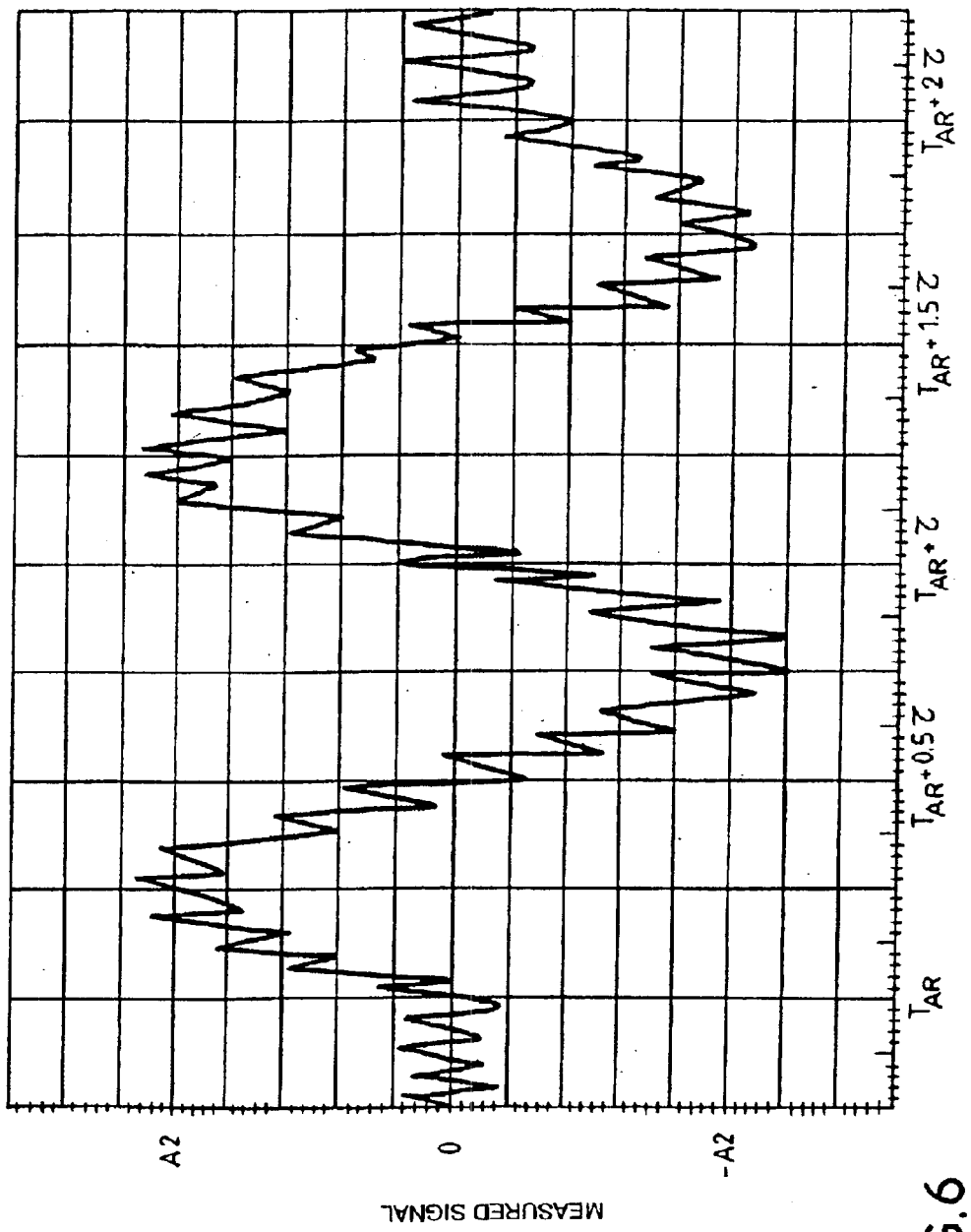

The subject of the invention is also a device for the implementation of the aforesaid process. Other characteristics and advantages of the invention will become more clearly apparent in the description which follows and in the appended drawings which represent:

FIG. 1, a part of a telephone network, an operator of which seeks to measure the attenuation of the lines by using the invention;

FIG. 2, an exemplary embodiment according to the invention of an electronic card represented in FIG. 1;

FIG. 3, an exemplary measurement process according to the invention;

FIG. 4, the shape of a signal measured after the emission of a pulse on the line according to the example of FIG. 3;

FIG. 5, the shape of a sinusoidal signal emitted on the line according to the example of FIG. 3;

FIG. 6, the shape of a signal measured on the line according to the example of FIG. 3.

Reference is now made to FIG. 1 in which is represented a part of a telephone network, an operator of which seeks to measure the attenuation of the lines 105. For this, the operator uses a measurement device according to the invention. The measurements are performed in a centralized manner on workstations 101, 102, 103 connected to an internal network 104 of the operator. The internal network 104 is used by the telephone operator to record the times of communications of his subscribers. In a more general manner the telephone operator uses the internal network 104 to manage his telephone network. Of course, the subscribers of the operator are connected to the telephone network but not to the internal network 104.

The telephone operator seeks to measure the attenuation of the lines 105 of a part of this network. The lines 105 are linked to a switch 106, which is controlled by a directing control unit (UD) 108, also referred to as the "Main Control Unit" (MCU). The directing control unit 108 is linked to the internal network 104 on the one hand, and to the switch 106 by a link 107 on the other hand. The directing control unit 108 is used by the telephone operator to establish telephone communications between subscribers. In a more general manner, the directing control unit 108 is used to manage that part of the telephone network which is formed by the lines 105. The number of lines 105 is around 20 000 and, they link subscribers to the switch 106.

The measurements on the telephone lines, such as the measurements of voltage, of parasitic current, of capacitances, of insulation resistance, are carried out by measurement robots. In a general manner, the measurement robots make it possible to measure the conducting properties of the telephone lines by using direct or alternating currents. Certain measurement robots have echometer cards which make it possible moreover to carry out impulse measurements. Measurement robots are referred to as "Test and Diagnostic Units" (TDUs).

The directing control unit 108 is linked to a measurement robot 109 by way of a link 110. Of course, the directing control unit 108 is linked in the same manner to several switches and several measurement robots. The directing control unit 108 serves as facility for managing the robots. Each switch is associated with a measurement robot. The measurement robot 109 contains an electronic card 111 which makes it possible to perform attenuation measurements according to the invention.

The telephone operator's technicians remotely control the measurements on the lines. To do this, they use workstations linked to the internal network 104, such as the stations 101, 102 and 103. From a workstation, a technician can select a telephone line on which he wishes to perform measurements. The number of the line selected by the technician is transmitted from the workstation to the directing control unit 108 by way of the internal network 104. Then the directing control unit 108 actuates the switch 106 so as to link the line to be tested to the measurement robot 109. The directing control unit 108 manages the measurements requested by the technician, which measurements are carried out by the measurement robot 109. The result of these measurements is then transmitted over the network 104 to the technician's workstation.

Reference is now made to FIG. 2 in which is represented an exemplary embodiment according to the, invention of the electronic card 111 represented in FIG. 1. This electronic card 111 makes it possible to measure the attenuation of a line at a chosen frequency F. In our example, the frequency F is 300 kHz. An input 201 of the electronic card is intended to be linked to one end of the line to be tested. The electronic card comprises at least:

(a) a dispatcher 202, placed on the electronic card, linked to the input 201 of the card;
(b) a generator 203 of sinusoidal signals at the frequency F, placed on the electronic card 111 and linked to the dispatcher 202, so as to send a sinusoidal signal over the line, the sinusoidal signal having a given amplitude $A_1$;
(c) a means of measurement 204 of amplitude at the frequency F, placed on the electronic card 111 and linked to the dispatcher 202, so as to measure the amplitude $A_2$ of the sinusoidal signal reflected by the line;
(d) a means of calculation 205, placed on the electronic card 111 and linked functionally to an output 206 of the card on the one hand and to the means of measurement 204 on the other hand, so as to calculate the attenuation of the line at the frequency F from the measured amplitude $A_2$ and from the amplitude $A_1$ of the signal sent, and to send the result of the calculation to the output 206.

The electronic card 111 is linked by a link 207 to one end of the line to be tested. This link in the example of FIG. 1 is the link between the measurement robot 109 and the switch 106. Specifically, the electronic card 111 is in the measurement robot 109, and the switch 106 is linked to the lines to be tested 105. Consequently, the electronic card 111 is linked to one end of the line to be tested.

The means of calculation 205 is linked to the output 206, which is linked by a link 208 to the measurement robot 109 of FIG. 1. Of course, the electronic card 111 is not necessarily included in a measurement robot. Other exemplary uses of this electronic card 111 may be mentioned, such as in a handheld measurement apparatus, or in a computer. In a handheld apparatus, the output of the electronic card 111 can be linked to a display device for example.

The dispatcher 202 is a duplexer in our example. A dispatcher having more than two outputs can be useful if the electronic card 111 makes it possible to perform other measurements on the line.

The means of calculation 205 is a microprocessor. Of course, it is possible to use other means of calculation, such as a digital signal processor (DSP), specialized electronic circuits, an analog means of calculation (voltage divider), or any other means of calculation. If the attenuation is expressed in decibels, the means of calculation 205 carries out the following operation:

$$S = 10\log\left(\frac{A_1}{A_2}\right) \quad (1)$$

In relation (1), S is the result of the calculation (in decibels) carried out by the means of calculation 205. In this relation, the coefficient 10 corresponds to 20 divided by 2. Specifically, the attenuation of the signal emitted is measured directly over an outward/return journey, that is to say twice (in decibels) the attenuation of the line in an outward journey. Consequently, the attenuation measured over an outward and return journey must be divided by 2 to obtain the attenuation over an outward journey.

If the end of the line not linked to the electronic card 111, referred to as the termination, does not reflect the signal 100%, it is possible to modify relation (1) as follows:

$$S = \log\left(\frac{R \times A_1}{A_2}\right) \quad (2)$$

In relation (2), R represents the reflection coefficient of the end of the line at the frequency F. This coefficient can be measured once and for all if the terminations of the lines are identical. The measurement of this coefficient R can be made during a calibration of the measurement apparatus comprising the electronic card. Generally, the termination of a line is at a subscriber's premises, that is to say a telephone socket or a telephone apparatus. When the telephone apparatus is not off-hook, this termination is an open circuit whose reflection coefficient is close to 100%.

The generator 203 of sinusoidal signals comprises the microprocessor 205 and a digital/analog converter 209. The microprocessor 205 samples a digital sinusoid of frequency F (300 kHz), which is converted into an analog signal by the digital/analog converter 209. Of course, it is possible to use other generators, such as an analog local oscillator frequency-controlled by a voltage or a digital signal, or an analog local oscillator adjusted to the frequency F, or any other generator of sinusoidal signals at the frequency F.

The means of measurement of amplitude 204 comprise the microprocessor 205, an analog/digital converter 211, and an amplifier 210. The amplifier 210 makes it possible to amplify the signal reflected by the line. Of course, the amplification coefficient is known. The amplifier 210 makes it possible to boost the signal to levels which allow good digitization. The analog/digital converter 211 digitizes the amplified signal. The microprocessor 205 calculates the amplitude $A_2$ from the samples digitized by the analog/digital converter 211. Of course, it is possible to use other means of measurement of amplitude, such as for example a detector of envelope at the frequency F, an analog filter and an integrator, or any other means of measurement. Thus, the means of measurement of amplitude 204 can deliver an analog signal which will be processed in an analog manner by the means of calculation 205.

The means of measurement of amplitude 204 comprises the microprocessor 205, consequently the link between the means of measurement of amplitude 204 and the means of calculation 205 is functional. Specifically, this link is internal to the microprocessor 205. It makes it possible to transmit the measured amplitude $A_2$ from the measurement means 204 to the calculation means 205. The invention allows a telephone operator to test the attenuation of the lines at 300 kHz. This measurement makes it possible to determine which lines do or do not support the throughputs related to ADSL technology. The measurements make it possible to rate lines which it would not have been possible to rate from a simple theoretical calculation of attenuation. The measurements therefore make it possible to bring ADSL technology to a maximum of subscribers.

Moreover, these measurements are inexpensive relative to the known techniques. Specifically, the electronic cards according to the invention are sited at one end of the line to be tested. Stated otherwise, it is not necessary to call upon two technicians to test a line. Moreover, if the measurements are performed at the level of a switch, a single technician can test of the order of 20 000 lines.

Furthermore, the electronic cards being stored in measurement robots, the measurements of fading can be controlled remotely by a technician. Stated otherwise, the management of the attenuation measurements is centralized. This makes it possible on the one hand to define zones of networks supporting ADSL technology so as to tender commercial offers in these regions. Additionally, the centralized management of the measurements makes it possible to respond directly to a consumer wishing to take out a subscription using ADSL technology. A technician can determine in a few seconds, by virtue of the invention, whether said consumer's line supports ADSL technology.

A measurement process which makes it possible to measure the attenuation of a line at a chosen frequency F is now described. This measurement process can be implemented in particular by the measurement robot 109 illustrated in FIG. 1 comprising the electronic card 111. Of course, this measurement process can also be implemented by other measurement apparatuses, such as handheld apparatuses or by a combination of measurement apparatuses. The measurement process comprises at least the following steps:

(a) the emission of a sinusoidal electric signal of amplitude $A_1$, at one end of the electric line;
(b) the measurement of the amplitude $A_2$ of the signal reflected by the other end of the line, at the end of the line from where the signal was emitted;
(c) the determination of the attenuation of the line from the amplitude of the signal emitted $A_1$ and from the amplitude of the signal received $A_2$.

According to an advantageous mode of implementation, the sinusoidal electric signal is emitted for a duration less than the outward and return time of a wave on the line. This makes it possible to preclude interference between the signal emitted and the signal reflected.

According to another advantageous mode of implementation, the measurement of the amplitude $A_2$ of the reflected signal is synchronized with the reflected signal, so as to improve the signal-to-noise ratio.

According to another advantageous mode of implementation, the electric signal emitted comprises an integer number of arcs of a sinusoid, so as to preclude an amplitude jump at the beginning or at the end of the emission.

Reference is now made to FIG. 3 in which is illustrated an exemplary measurement process according to the invention. In this example, the process is implemented by a measurement robot such as that illustrated in FIG. 1. Of course, this process can be implemented by other devices.

During a first step, the length of the line to be tested is measured 301. This measurement can be carried out with an echometer placed in the measurement robot. The technique used consists in sending an electric pulse over the line, and measuring the outward and return time of this pulse. Reference is made to FIG. 4 in which is represented the shape of a signal measured after the emission of a pulse on the line. The speed of movement of a wave on the line being known from the physical characteristics of the line, it is possible to convert the times into distance. The time and distance conversion ratio may be of the order of 11 μs/km. Consequently the abscissa axis, which corresponds to the time elapsed after the emission of the pulse, is graduated in terms of distance. The ordinate axis is graduated on a scale normalized with respect to the amplitude of the pulse emitted. In this example, the pulse emitted on the line comprises a first signal spike, immediately followed by a second signal spike of opposite sign and of like amplitude. The line reflects the pulse 401 a first time. This reflection corresponds to the impedance mismatch at the line input. This impedance mismatch may arise from the dispatcher for example. Further on, another impedance mismatch causes a parasitic reflection 402. This impedance mismatch is a defect of the line. Such a defect may originate for example from a poor connection in a subdistributor (SR) or a point of concentration (PC) of the network. The pulse emitted is reflected by the line a last time 403. This reflection is the echo from the end of the line. The beginning of the echo 404 corresponds to the length of the line. In this example, the line measures 4.8 km. Stated otherwise, the time elapsed between the emission of the pulse and the detection of the echo 403 is the outward and return time over the line. This time is directly proportional to the length of the line to be tested.

After this measurement of the length of the line 301, the outward and return time, denoted $T_{AR}$, of a pulse on the line is known. From this time $T_{AR}$ is calculated 302 the number of arcs of a sinusoidal N satisfying the following relation:

$$N = E(2 \times T_{AR} \times F) \qquad (3)$$

In relation (3), E represents the integer part function. The number N is the number of arcs of a sinusoid at 300 kHz (value of the frequency F in this example), such that the duration of the sinusoid is less than the outward and return time $T_{AR}$, and such that this sinusoid can start and terminate with zero. Stated otherwise, N is the largest number of arcs of a sinusoid such that the total length of the sinusoid is less than the time $T_{AR}$. The period of the sinusoid at the frequency F is denoted π, and the duration of the sinusoid at the frequency F having N arcs is denoted $T_{SIG}$. These two quantities are related by the following relation:

$$T_{SIG} = \frac{1}{2} \times N \times \tau \qquad (4)$$

Of course, it is also possible to emit the signal for a duration $T_{SIG}$ greater than the outward and return time $T_{AR}$. There would then be interference between the signal emitted and the signal reflected. The reflected signal will first of all be interference-free for a duration $T_{AR}$, then will have interference for a duration $T_{SIG}-T_{AR}$. The first part of the reflected signal can then be used in the subsequent steps in the same way as if the signal had been emitted for a duration $T_{SIG}$ less than $T_{AR}$.

It is also possible to emit a signal which is not a pure sinusoid. This signal can comprise a spectral line at the frequency F of amplitude $A_1$ for example, or more generally a nonzero component at the frequency F. The following description remains valid on replacing the sinusoidal signal of amplitude $A_1$ with a signal whose spectral component at the frequency F has an amplitude $A_1$.

In order to improve the signal-to-noise ratio, a calibration 303 of the gain of the amplifier 210 can be carried out. This calibration 303 makes it possible to obtain the best possible digitization of the measured signal. To do this, a sinusoidal electric signal of frequency F is emitted in an iterative manner by varying the gain G of the amplifier 210 at each iteration. The highest possible gain G which does not cause saturation of the analog/digital converter 211 is maintained. In order to be able to use the largest possible gain, the amplifier 210 is activated only for the duration of return of the useful signal. In this way, there is no amplification of the signal reflected at the beginning of the line (impedance mismatch at the line input). This signal reflected at the beginning of the line would saturate the analog/digital converter 210 before the useful signal had reached a maximum level. The optimal gain G thus determined is kept for the subsequent measurements.

A wave train at 300 kHz is then emitted 310, that is to say a sinusoidal electric signal of frequency F for a duration $T_{SIG}$. Reference is made to FIG. 5 in which the sinusoidal signal emitted is represented. The signal is emitted during N arcs of a sinusoid, where N is defined in relation (3). In this example, N=4. The duration of emission of the signal is $T_{SIG}$, namely $2\times\pi$ in this example. In the absence of emission, the voltage on the line is zero. The emission begins at the point 501, taken as time origin on the abscissa axis. The amplitude of the signal emitted is $A_1$. For the duration $T_{SIG}$, 4 arcs of a sinusoid are emitted. Emission terminates at the point 502. The time which separates these two points is exactly $T_{SIG}$. Before the beginning and after the end of the emission, that is to say before the point 501 and after the point 502, the voltage on the line is zero. The number of arcs of a sinusoid being an integer, there is no voltage jump either at the beginning or at the end of the emission. The spectrum of the emitted signal therefore comprises a spike at the frequency F which is not polluted by edge effects at the beginning or end of emission.

After the emission 310 of a wave train, the return of the signal reflected at the line extremity is awaited. This signal returns to the end of the line from where it was emitted after the duration $T_{AR}$. The recording 311 of the reflected signal is then begun. Knowing the duration of the emitted signal, $T_{SIG}$, the recording is stopped when there is no longer any signal. Stated otherwise, the measurement 311 of the reflected signal is activated only for the scheduled period of its return to the end of the line from where it was emitted.

Reference is now made to FIG. 6 in which a measured signal is represented. This signal is noisy and generally has a low amplitude. In order to improve the measurement of the amplitude of the reflected signal, the latter can be amplified by a known factor, by an amplifier such as the amplifier of the electronic card 111 for example. In order to preclude noise-related disturbances, this amplitude is activated only for the scheduled period of the return of the sinusoid. This is why the measurement of the amplitude $A_2$ of the reflected signal is said to be synchronized with the reflected signal. Amplification and recording may for example be synchronized with the clock of a microprocessor which enabled the signal to be generated.

There are two different kinds of noise on the lines. A first noise, the so-called stationary noise, has statistical properties which are constant over time. This stationary noise is Gaussian noise for example. A second noise, the so-called impulsive noise, appears randomly in the measurements. This impulsive noise may appear in 1 measurement out of around 1000. It originates in particular from radio disturbances caused by the passing of a train near a line or by a radio emission for example.

In order to improve the signal-to-noise ratio, the impulsive noise can be eliminated by comparing 312 the measured signal with a reference signal. This reference signal may for example be the average power of a reflected signal. If a measurement has an abnormal power, it is rejected 314. Stated otherwise, the overly powerful signals, that is to say those which contain impulsive noise, are discarded.

Additionally, the signal-to-noise ratio can be improved by averaging several measurements. This averaging makes it possible to reduce the stationary noise, that is to say to increase the signal-to-noise ratio. A measurement may last of the order of 200 $\mu$s. Consequently, it is possible to carry out of the order of 1000 measurements in 2 to 3 seconds. The signal-to-noise ratio can be increased by a factor of around 30 with 1000 measurements. After each measurement, an averaging with the other measurements is performed 313. A test 315 then checks whether the number of averaged measurements is sufficient. If another measurement is necessary, we start again from step 310, otherwise a processing of the measured signal is carried out.

During the processing of the signal, a digital filtering of the measured data can be performed. This filtering makes it possible in particular to correct the distortion effects engendered by the telephone lines. This filtering can for example be a filtering 320 around the frequency F, namely 300 kHz in our example. This filtering 320 can be carried out by convolving the signal with a finite impulse response (FIR) filter. Such filtering makes it possible to increase the signal-to-noise ratio. It is known that the signal emitted has the frequency F, consequently the other frequencies correspond to noise. This filtering can be carried out by a microprocessor for example. Of course, it is also possible to carry out an analog filtering around the frequency F during the recording of the data. These two filterings, digital on the one hand, and analog on the other hand, may be carried out in succession.

The amplitude $A_2$ of the signal is then determined 321 from the recorded data. This determination can be effected with the application of a Fourier transform or with the method of least squares for example.

The attenuation of the line is calculated 322 from the amplitude $A_2$ and from the amplitude $A_1$ using relation (1) for example.

The result of the calculation, namely the attenuation of the line, is then sent 323 to the directing control unit.

The measurement 311, the averaging 313, the digital filtering 320, and the digital determination 321 is merely an example for measuring the amplitude $A_2$ of the reflected signal. It is possible to measure the amplitude of the reflected signal by using other techniques, such as analog techniques for example.

Of course, the invention is not limited to the examples described hereinabove. The invention applies equally to communication networks and energy transport networks. In general, it applies to any type of electric line whose attenuation at a frequency F one seeks to measure.

What is claimed is:

1. A measurement process for measuring the attenuation of a line at a given frequency F and comprising the following steps:
    (a) the emission of an electric signal at one end of the electric line, said signal comprising a spectral component of amplitude $A_1$ at the frequency F;
    (b) the measurement of the signal reflected by an other end of the line, at an end of the line from where the signal was emitted;
    (c) a determination of the amplitude $A_2$ of the spectral component at the frequency F of the reflected signal;

(d) a determination of the attenuation of the line from the ratio of the amplitude $A_2$ to the amplitude $A_1$;

wherein the electric signal is emitted for a duration less than the outward and return time of a wave on the line, so as to preclude interference between the signal emitted and the signal reflected during the measurement.

2. The measurement process as claimed in claim 1, wherein the measurement of the reflected signal is synchronized with the reflected signal, so as to improve the signal-to-noise ratio.

3. The measurement process as claimed in claim 1, wherein the stationary noise is attenuated by repeating the emission and measurement steps, then by averaging said measurements.

4. The measurement process as claimed in claim 1, wherein the impulsive noise is eliminated by rejecting the measurements having abnormally high power relative to a reference signal.

5. The measurement process as claimed in claim 1, wherein the electric signal emitted has a sinusoidal form.

6. The measurement process as claimed in claim 5, wherein the electric signal emitted comprises an integer number of arcs of a sinusoid, so as to preclude an amplitude jump at the beginning or at the end of the emission.

7. The measurement process as claimed in claim 1, further comprising a step of filtering by a bandpass filter, centered around the frequency F.

8. The measurement process as claimed in claim 1, wherein the amplitude $A_2$ is determined from measurements of the reflected signal's sampled amplitudes on which a linear regression is carried out.

9. The measurement process as claimed in claim 1, wherein the amplitude $A_2$ is determined from measurements of the reflected signal's sampled amplitudes on which a Fourier transform is carried out.

10. A measurement device for measuring the attenuation of a line at a chosen frequency F, comprising;

(a) emission means for emitting an electric signal intended to be linked to one end of the line, said signal comprising a spectral component of amplitude $A_1$ at the frequency F;

(b) measuring means for measuring the amplitude $A_2$ of the spectral component at the frequency F of the signal reflected at the other end of the line, and intended to be linked to the end of the line from where the signal was emitted;

(c) calculating means for determining the attenuation of the line from the ratio of the amplitude $A_2$ to the amplitude $A_1$; and (d) measuring means for measuring the outward and return time of a wave on the line, and being functionally linked to the emission means, so as to emit the sinusoidal electric signal for a duration less than said outward and return time.

11. The measurement device as claimed in claim 10, further comprising synchronization means for measuring the amplitude $A_2$ for the scheduled period of the return of the signal.

12. The measurement device as claimed in claim 10, further comprising an analog bandpass filter, centered around the frequency F, so as to eliminate noises before the measurement of the amplitude $A_2$.

13. The measurement device as claimed in claim 10, wherein the calculation means carries out a digital filtering, centered around the frequency F, so as to eliminate measurement noises during the measurement of the amplitude $A_2$.

14. The measurement device as claimed in claim 10, wherein the calculation means acts on the means of measurement so as to average several signals.

15. An electronic card to measure the attenuation of a line at a chosen frequency F, an input of the electronic card being intended to be linked to one end of said line, the electronic card comprising:

(a) a dispatcher, placed on the electronic card, linked to the input of the card;

(b) a generator of sinusoidal signals at the frequency F, placed on the electronic card and linked to the dispatcher, so as to send a sinusoidal signal over the line, the sinusoidal signal having a given amplitude $A_1$, and a duration less than the outward and return time of a wave on the line;

(c) measurement means for measuring amplitude at the frequency F, placed on the electronic card and linked to the dispatcher, so as to measure the amplitude $A_2$ of the sinusoidal signal reflected by the line;

(d) calculation means, placed on the electronic card and linked functionally to an output of the card on one hand and to the means of measurement on another hand, so as to calculate the attenuation of the line at the frequency F from the measured amplitude $A_2$ and from the amplitude $A_1$ of the signal sent, and to send the result of the calculation to the output.

16. A measurement robot, comprising an electronic card to measure the attenuation of a line at a chosen frequency F, an input of the electronic card being intended to be linked to one end of said line, the electronic card comprising:

(a) a dispatcher, placed on the electronic card, linked to the input of the card;

(b) a generator of sinusoidal signals at the frequency F, placed on the electronic card and linked to the dispatcher, so as to send a sinusoidal signal over the line, the sinusoidal signal having a given amplitude $A_1$, and a duration less than the outward and return time of a wave on the line;

(c) measurement means for measuring amplitude at the frequency F, placed on the electronic card and linked to the dispatcher, so as to measure the amplitude $A_2$ of the sinusoidal signal reflected by the line;

(d) calculation means, placed on the electronic card and linked functionally to an output of the card on one hand and to the means of measurement on another hand, so as to calculate the attenuation of the line at the frequency F from the measured amplitude $A_2$ and from the amplitude $A_1$ of the signal sent, and to send the result of the calculation to the output.

* * * * *